United States Patent
Kurogouchi et al.

(10) Patent No.: US 6,466,064 B2
(45) Date of Patent: Oct. 15, 2002

(54) FREQUENCY MULTIPLIER DEVICE AND FREQUENCY MULTIPLIER CIRCUIT

(75) Inventors: Yasuhiro Kurogouchi, Kasugai (JP); Kazuyoshi Arimura, Kasugai (JP); Yoshinobu Hattori, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/939,750

(22) Filed: Aug. 28, 2001

(65) Prior Publication Data

US 2002/0125924 A1 Sep. 12, 2002

(30) Foreign Application Priority Data

Jan. 29, 2001 (JP) .......................... 2001-019327

(51) Int. Cl.[7] .............. H03B 19/00; G06G 7/12
(52) U.S. Cl. ............. 327/113; 327/355; 327/119; 327/455
(58) Field of Search ................ 327/105, 113, 327/116, 355, 357, 121, 119; 455/333

(56) References Cited

U.S. PATENT DOCUMENTS 6,100,731 A * 8/2000 Otaka .................. 327/119

FOREIGN PATENT DOCUMENTS

JP    20000031915   * 1/2000

* cited by examiner

Primary Examiner—Dinh T. Le
(74) Attorney, Agent, or Firm—Arent Fox Kintner Plotkin & Kahn

(57) ABSTRACT

It is intended to provide a compact circuit configuration used for a frequency multiplier device, suitable to selectively output among a plurality of multiplied frequencies, with less power consumption. The frequency multiplier device uses an input frequency signal f and an output multiplied signal nf to form original signals a and c, as well as phase shifted signals b and d that are phase shifted to $\pm\pi/2$ from the original signals a and c, the signals are mixed in a mixer circuits 16 and 17 and summed in a summing amplifier 18 to generate an output frequency signal fOUT. The phase inverter circuit (differential amplifier circuit) 14 and selector circuit (SEL1) 33 controls the phase inversion of one of signals to selectively output one of mixed frequencies $(n\pm1)f$ as the output frequency signal fOUT. A selector circuit (SEL2) 34 turns off a on-off switch circuit 32 to block the input frequency signal f while at the same time operate the mixer circuits 16 and 17 as the differential amplifier 25 to output the output multiplied signal nf as the output frequency signal fOUT.

20 Claims, 10 Drawing Sheets

FREQUENCY MULTIPLIER DEVICE DIRECTED TO FIRST EMBODIMENT

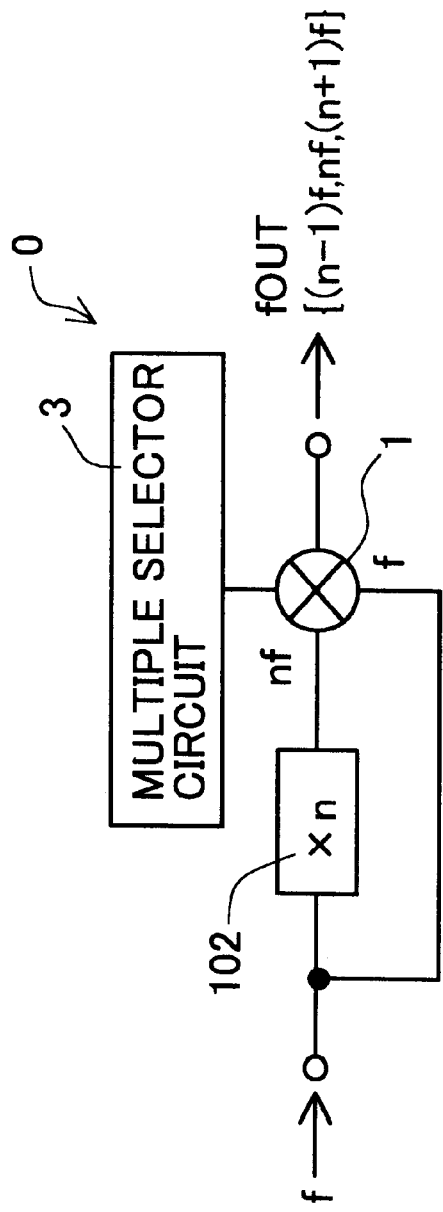
FIG.1 PRINCIPLE OF OPERATION IN ACCORDANCE WITH THE PRESENT INVENTION

OUTPUT SPECTRA OF MIXER CIRCUIT IN ACCORDANCE WITH THE PRESENT INVENTION
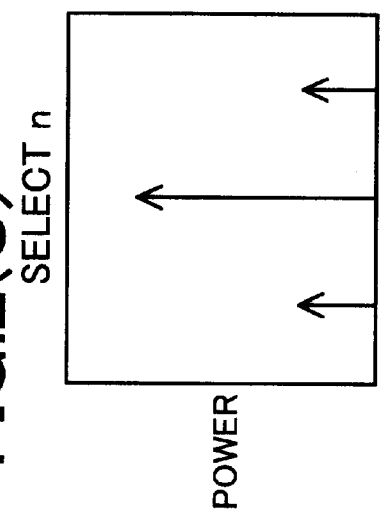
FIG.2(A) SELECT(n+1)
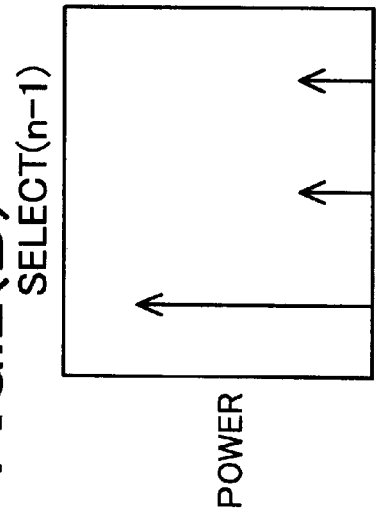
FIG.2(B) SELECT(n−1)
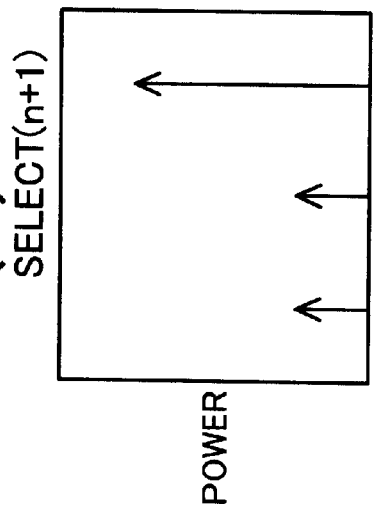
FIG.2(C) SELECT n

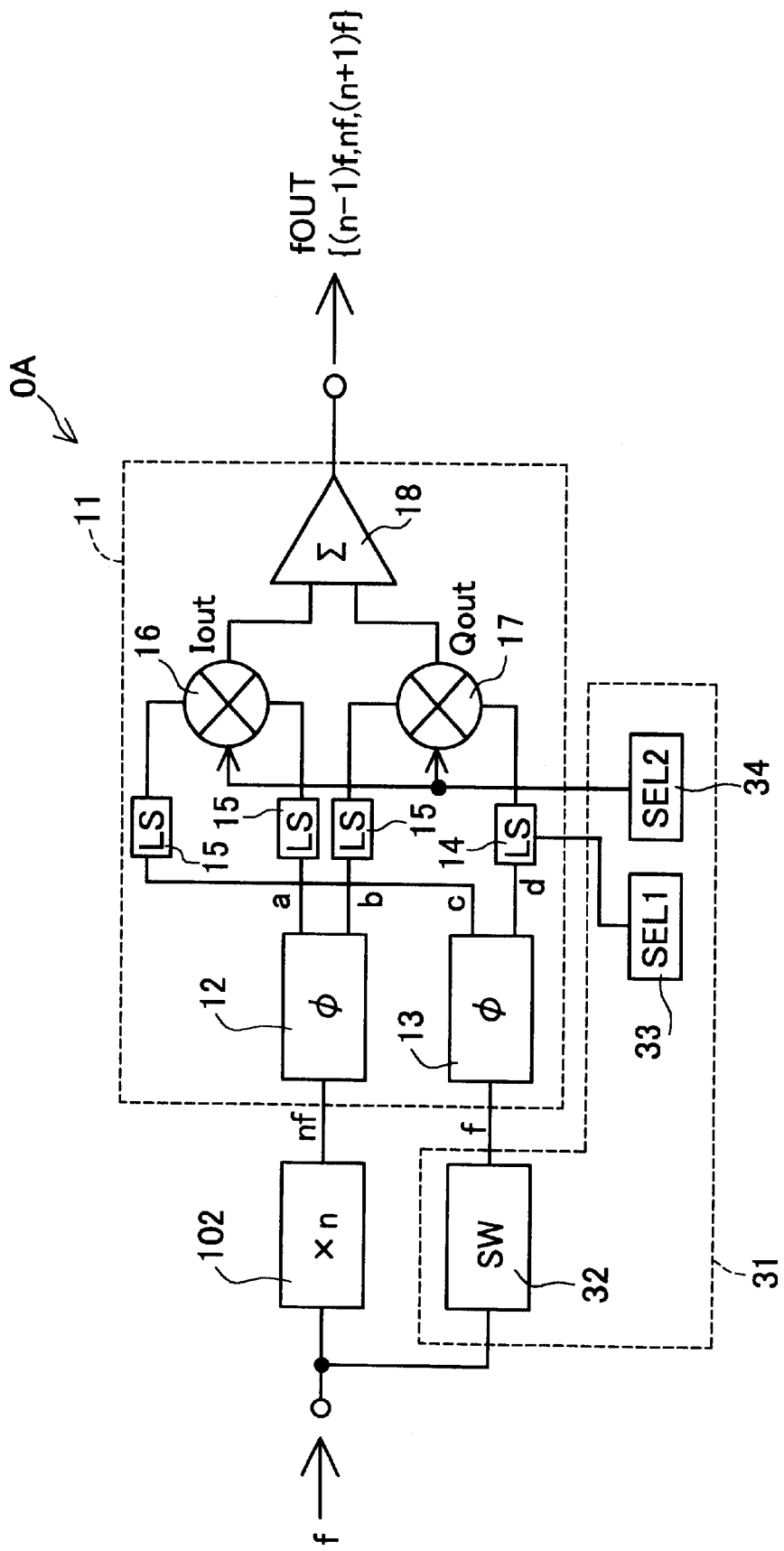
FIG.3 FREQUENCY MULTIPLIER DEVICE DIRECTED TO FIRST EMBODIMENT

CIRCUIT DIAGRAM OF A TYPICAL EXAMPLE OF PHASE INVERTER CIRCUIT DIRECTED TO FIRST EMBODIMENT

SELECTOR TYPE 1

SELECTOR TYPE 2

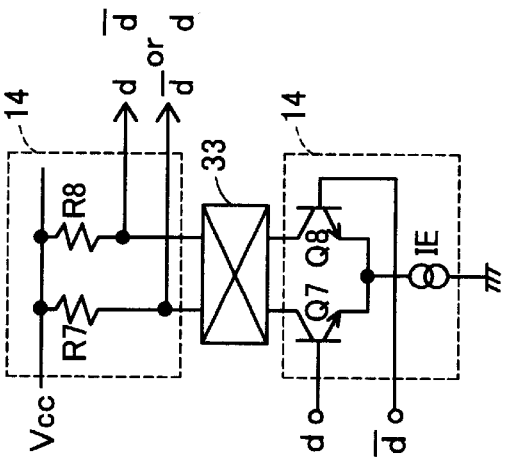
FIG.5(A)
IN CASE OF SWITCHING INPUT SIGNALS
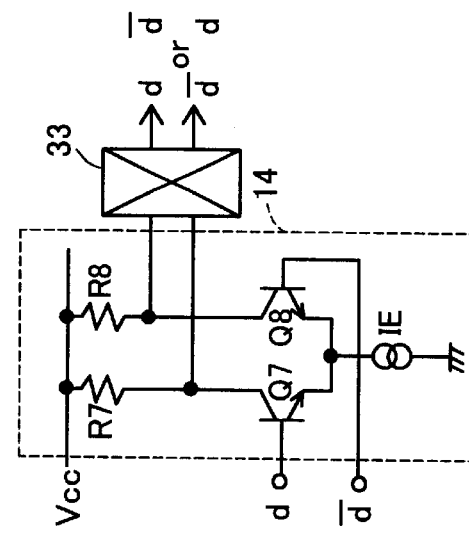
FIG.5(B)
IN CASE OF SWITCHING OUTPUT SIGNALS
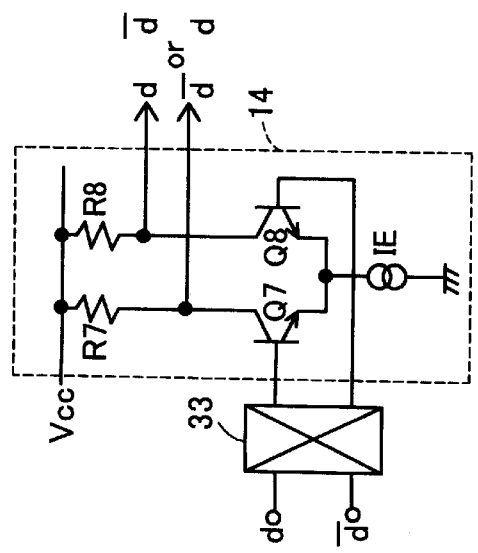
FIG.5(C)
IN CASE OF SWITCHING THE CONNECTION BETWEEN DIFFERENTIAL PAIR AND LOAD CIRCUIT
CIRCUIT DIAGRAM OF ANOTHER TYPICAL EXAMPLE OF PHASE INVERTER CIRCUIT DIRECTED TO FIRST EMBODIMENT
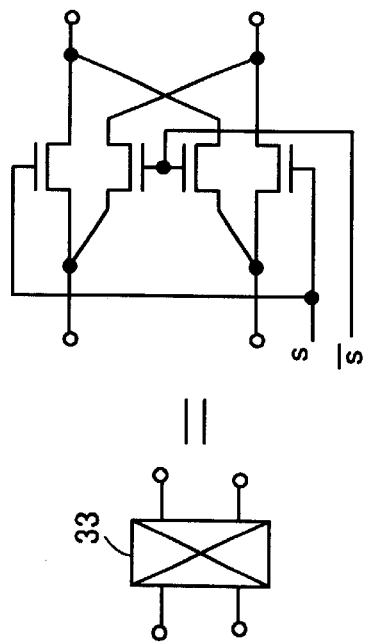

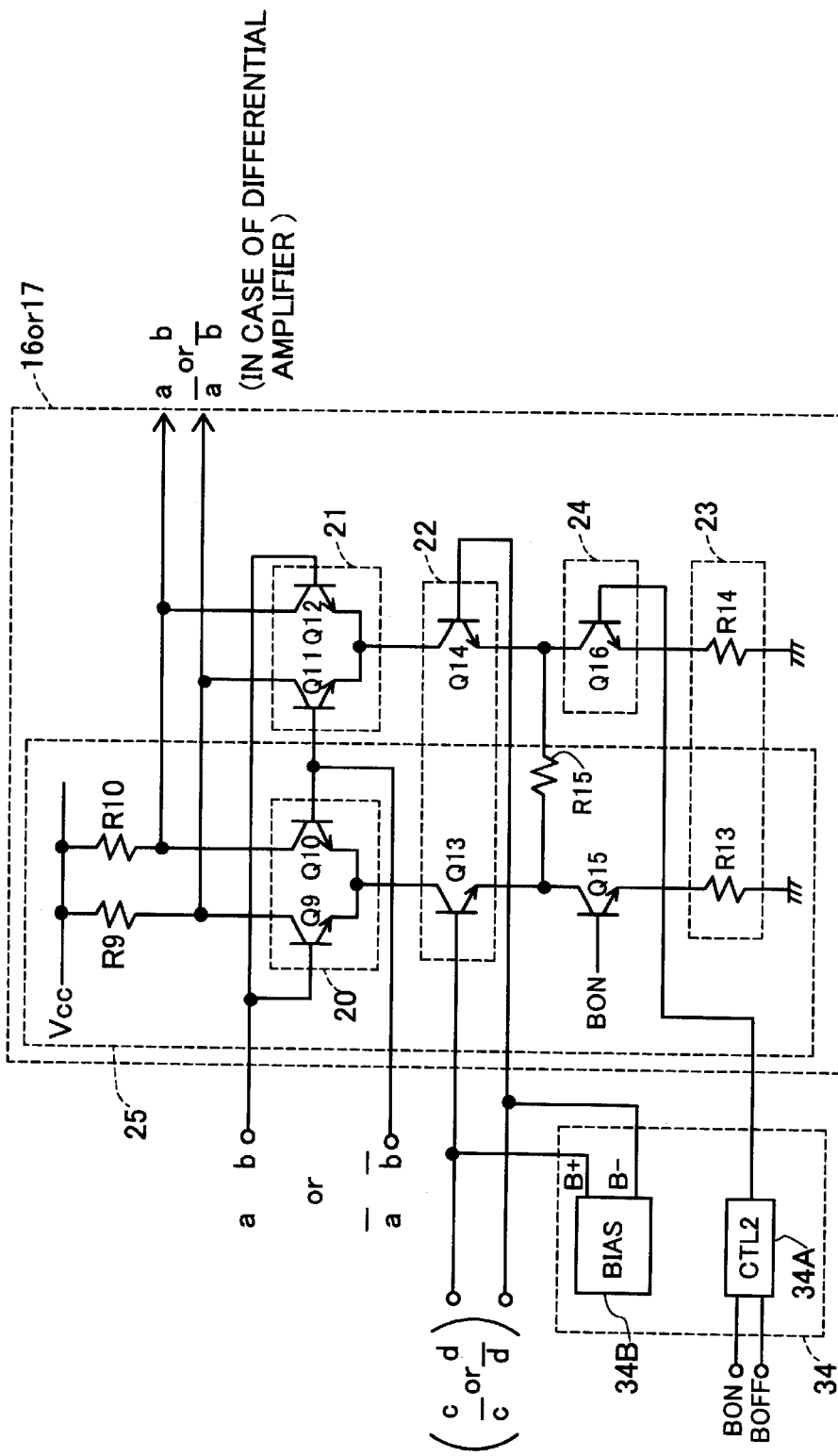
FIG.6 FIRST EXAMPLE OF CIRCUIT CONFIGULATION USING MIXER CIRCUIT DIRECTED TO FIRST EMBODIMENT AS DIFFERENTIAL AMPLIFIER

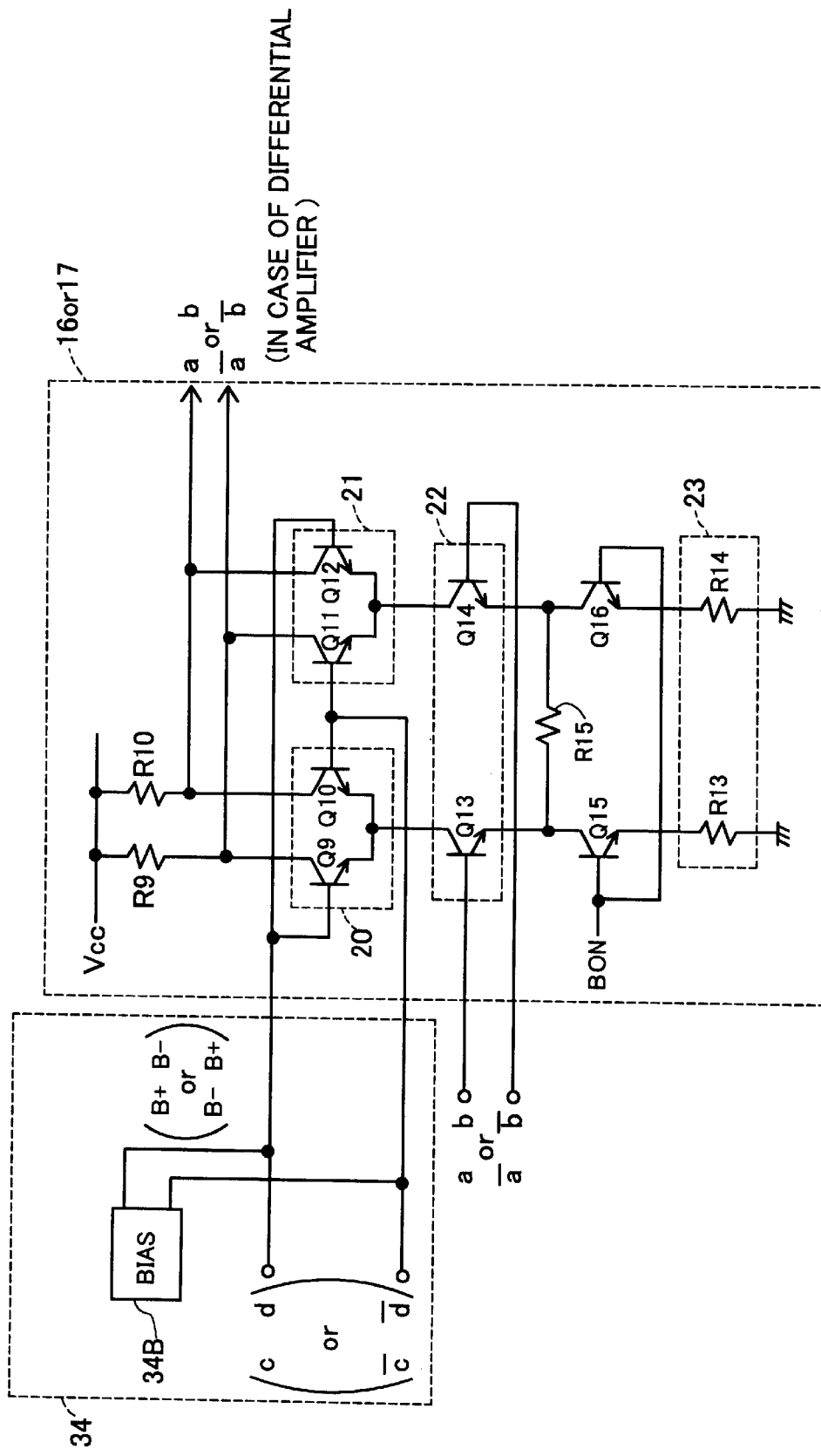
FIG.7 SECOND EXAMPLE OF CIRCUIT CONFIGULATION USING MIXER CIRCUIT DIRECTED TO FIRST EMBODIMENT AS DIFFERENTIAL AMPLIFIER

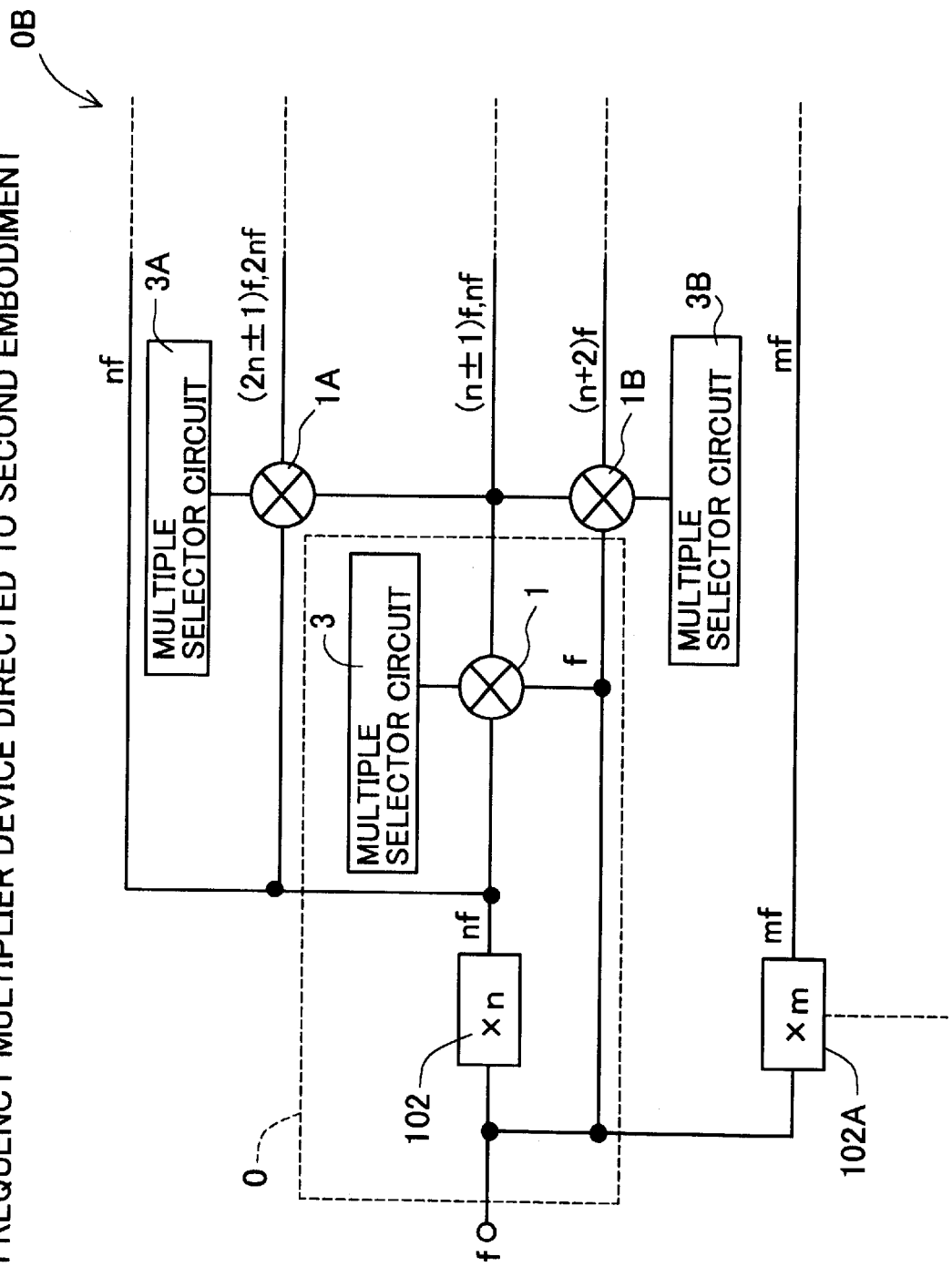
FIG.8 FREQUENCY MULTIPLIER DEVICE DIRECTED TO SECOND EMBODIMENT

FREQUENCY MULTIPLIER DEVICE OF PRIOR ART

SPECTRA FROM MIXER CIRCUIT OF PRIOR ART

FREQUENCY MULTIPLIER DEVICE AND FREQUENCY MULTIPLIER CIRCUIT

BACKGROUND OF THE INVENTION

1. Field of the Invention

The present invention relates to a frequency multiplier device and more particularly to a frequency multiplier device suitably used in mobile communication devices.

2. Description of the Related Art

In recent mobile communication devices, including cellular phones, the number of transmission carrier frequency bands has been increased for effective use of frequencies. The mobile communication devices are more capable of switching between carrier frequencies according to usage than ever. Accordingly, the frequency multiplier devices are required to appropriately select among a plurality of multiplied frequencies. On the other hand, there exist continuous needs for such devices to incorporate as many functions as possible and as small housing as possible. In addition, the portable communication devices for mobile communication such as cellular phones are now often evaluated by low current consumption during calling, which is an important index with respect to the portability.

In order to use and select a plurality of frequencies required for the mobile communication, a solution according to the prior art is to include a number of frequency multiplier devices with different multiplication index one for each frequency, as many as required. Another solution is to use a circuit as shown in FIG. 9.

FIG. 9 shows a conventional frequency multiplier device 100. The frequency multiplier device 100 includes a frequency multiplier 102 with a multiplier factor n, a mixer circuit 101, a filter circuit A 104, another filter circuit B 105, two other filter circuits, and a switch circuit 103 for selectively connecting to one of filter circuits 104 and 105. Input frequency signals at a frequency f are input into the frequency multiplier 102 and into the mixer circuit 101. Output multiplied signals at a frequency nf, which has been multiplied by the frequency multiplier 102 by multiplier factor n, are also input into the mixer circuit 101. The mixer circuit 101 mixes two input signals f and nf to yield an output including two mixed signals, one having a frequency (n−1)f, another having a frequency (n+1)f. The output signals have spectra as shown in FIG. 10. One signal output having the frequency (n−1)f has a power level equal to another signal output having the frequency (n+1)f. No selectivity is present between those signals. Thus, either of frequency signal is extracted from the output signals having two frequency signals (n−1)f and (n+1)f mixed. A switch circuit 103 arranged in the following stage of the mixer circuit 101 is used for selectively connecting to one of the two filter circuits 104 and 105. More specifically, The filter circuit A 104 selects and passes only the signal of frequency (n−1)f while the filter circuit B 105 selects and passes the signal of frequency (n+1)f. The switch circuit 103 selects either of filters to output the signal of one desired frequency.

Another possible solution for implementing a frequency selection is based on a PLL synthesizer.

However, in the mobile communication, it is a problematic method to allocate frequency multiplier devices to respective carrier frequencies. That is, a mobile communication device requires a plurality of frequency multiplier devices, which results in a larger scale of circuitry. The structure such as the above may prevent devices from being smaller. In addition, the power consumption of the device as the sum of power consumption in each of frequency multiplier devices may be larger than desired for implementing a lower power consumption rate in a portable device, such as cellular phones.

The method shown in FIG. 9 needs filter circuits 104, 105 for every output frequencies (n−1)f and (n+1)f in order to select a desired output signal frequency. In addition, the switch circuit 103 for selecting a plurality of filter circuits 104, 105 is required. Furthermore, another filter circuit needs to be added for selecting an output signal of output frequency nf. As a result, similar to above conventional solutions, the scale of circuitry may be enlarged whereby the device cannot be built smaller, and the power consumption may be increased whereby the lower power consumption of the device is not realized.

When using a PLL synthesizer, some analog components including a charge pump circuit and a low pass filter are indispensable other than a PLL synthesizer composed of digitally controlled components such as frequency dividers and counter circuits. In addition, other circuit components such as voltage-controlled oscillators and prescallers are also necessary, which must operate at a very high rate. Consequently, the control system for each circuit block is complicated, thus enlarge the circuit scale and increase the power consumption, which results in a difficulty of achievement of the contemplated device with a smaller size and lower power consumption.

SUMMARY OF THE INVENTION

The present invention has been made in view of the above circumstances and has an object to overcome the above problems known in the prior art and to provide a frequency multiplier device which operates with lower power consumption, and which selects and outputs one of a plurality of multiplication frequencies.

To achieve the objects and in accordance with the purpose of the invention, as embodied and broadly described herein, the frequency multiplier device and frequency multiplier circuit in accordance with one aspect of the present invention, comprise:

a frequency multiplier for multiplying an input frequency signal by a predetermined multiplier to output an output multiplied signal;

a mixer circuit for mixing the input frequency signal and the output multiplied signal; and a multiple selector circuit for selecting one of the mixing characteristics of the mixer circuit to output an output frequency signal.

The frequency multiplier device uses its own multiple selector circuit to select one of mixing characteristics of the mixer circuit, without using an external circuit for selection. The frequency multiplier device therefore may select and output a desired output frequency signal with a predetermined multiplier from the mixing signal of the input frequency signal mixed with output multiplied signals.

Now referring to the accompanying drawings, FIG. 1 shows the principle of operation in accordance with the present invention set forth in claim 1, and FIG. 2 shows the output spectra. The frequency multiplier device 0 shown in FIG. 1 has an input frequency signal f (the frequency of which is f) fed to the frequency multiplier 102 of n multiplication as well as to the mixer circuit 1. In addition, an output multiplied signal nf (the frequency of which is nf) multiplied by the multiplier factor n by the frequency multiplier 102 is also fed to the mixer circuit 1. The mixer circuit 1 intermixes two signals, namely, the input frequency signal f and the output multiplied signal nf. The multiple selector circuit 3 selects a mixing characteristic of the mixer circuit 1 such that the multiplication of frequency of output frequency signal fOUT selectively output from the mixer circuit is be either one of (n−1), n, or (n+1).

The spectra of output frequency signal fOUT is shown in FIG. 2. The figure indicates that the selection of mixing characteristics of the mixer circuit 1 by the multiple selector circuit 3 allows the power level of either one of (n−1)f, nf, or (n+1)f to be selectively output.

Thus this configuration may selectively output the output frequency signal fOUT without adding any filter circuit in the following stage.

As can be seen, the selection of mixing characteristics of the mixer circuit allows picking up one frequency signal out of a plurality of frequency signals generated between the original input frequency signal and the output multiplied signal to output as the final output frequency signal. In this manner, there is no need to have one frequency multiplier device for each of frequencies used, as well as to extract or select an output signal from the mixer circuit with an externally equipped filter circuit or the like. In addition, a circuit configuration of a complex control system such as a PLL frequency synthesizer can be omitted. Therefore, the circuitry of a frequency multiplier device to selectively output one among a plurality of frequency signals may become compact, allowing the multiplier device to be much smaller than ever. Also, a compact circuit configuration may permit decreasing the power consumption for the circuit operation, so as to be able to implement a configuration conforming to the requirement of lowering power consumption. Furthermore, a complex control system may be unnecessary in this circuit configuration which is much simpler in the circuit operation so that a much stable operation can be estimated.

Therefore the present invention may provide a frequency multiplier device, which is compact, consumes less power, operates much stably, and which may be preferable to use in a mobile communication device, in particular in a portable device such as a cellular phone.

The above and further objects and novel features of the invention will more fully appear from following detailed description when the same is read in connection with the accompanying drawings. It is to be expressly understood, however, that the drawings are purpose of illustration only and not intended as a definition of the limits of the invention

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 1 shows the principle of operation in accordance with the present invention;

FIG. 2 shows output spectra of a mixer circuit in accordance with the present invention;

FIG. 3 is a schematic circuit diagram of a frequency multiplier device directed to first embodiment;

FIG. 5 is a schematic circuit diagram of another typical example of a phase inverter circuit directed to first embodiment;

FIG. 6 is a schematic circuit diagram of a typical example of a circuit configuration using the mixer circuit directed to first embodiment as a differential amplifier;

FIG. 7 is a schematic circuit diagram of another typical example of a circuit configuration using the mixer circuit directed to first embodiment as a differential amplifier;

FIG. 8 is a schematic circuit diagram of a frequency multiplier device directed to second embodiment;

DETAILED DESCRIPTION OF THE PREFERRED EMBODIMENTS

A detailed description of first and second embodiments embodying the frequency multiplier device in accordance with the present invention will now be given referring to the accompanying drawings.

Figure 4:
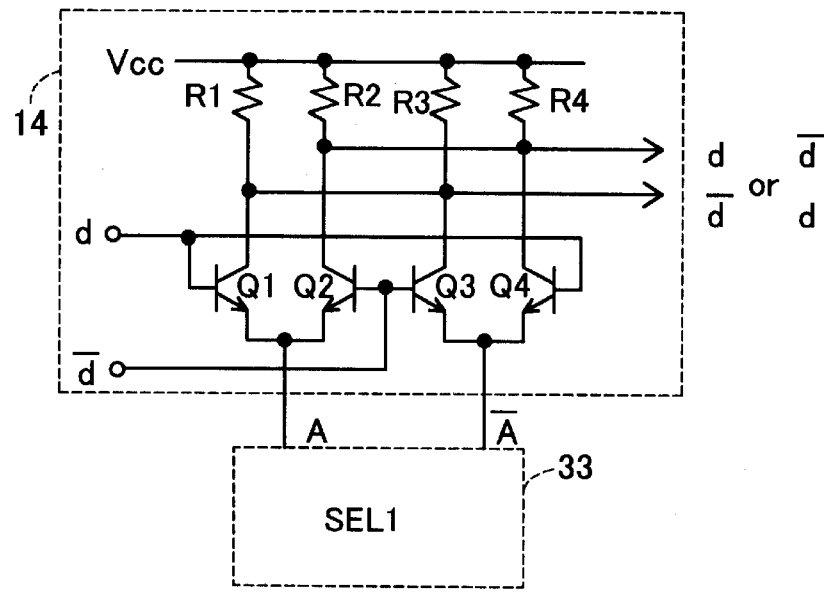
FIG. 4 is a schematic circuit diagram of a typical example of phase inverter circuit directed to first embodiment.
Figure 4A:
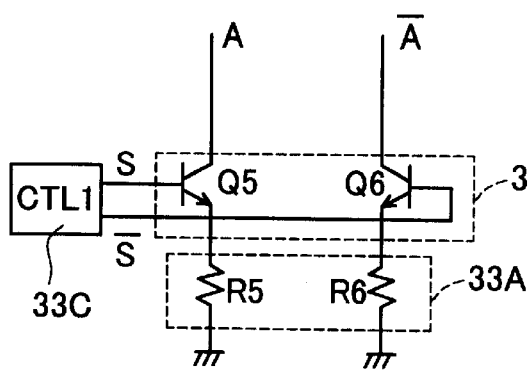
Figure 4B:
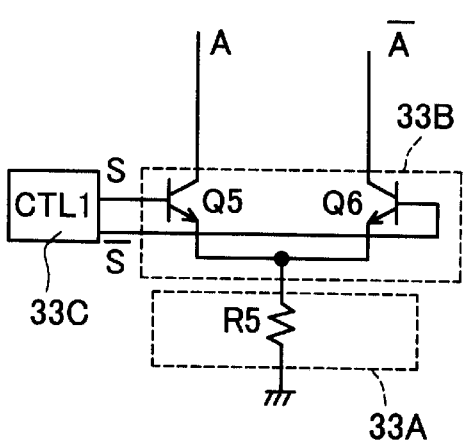
Figure 9:
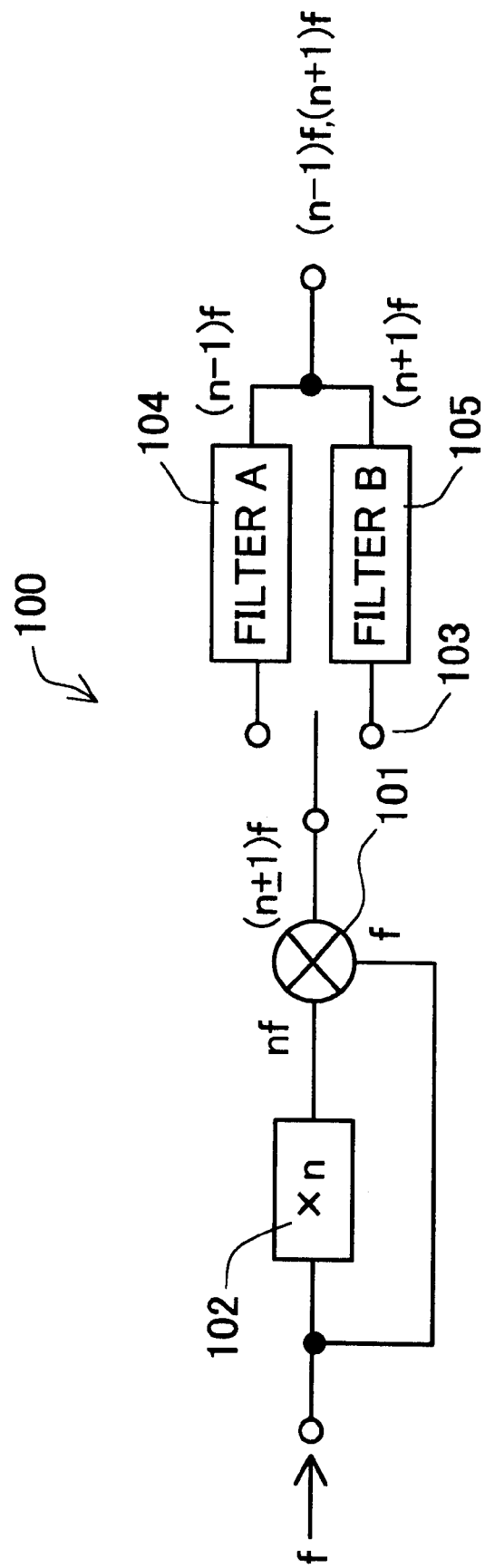
FIG. 9 is a schematic circuit diagram of a frequency multiplier device in accordance with the prior art.
Figure 10:
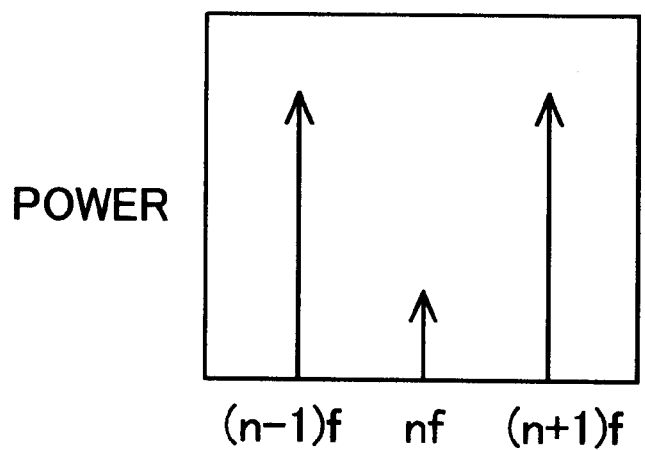
FIG. 10 shows output spectra from the mixer circuit of the prior art.

The first embodiment of the present invention is shown in FIG. 3 to FIG. 7. In the figures, FIG. 4 and FIG. 5 represent a typical exemplary phase inverter circuit, used in a single sideband mixer circuit 11 for inverting or not inverting the phase of input signals to determine which of two signals obtainable by mixing is to be selectively output as the output frequency signal.

FIG. 6 and FIG. 7 represent a typical example of differential pairs 20 to 22, which are primary components operating as the single sideband mixer circuit 11 to operate as a differential amplifier 25 when input frequency signals are shut off.

Now referring to FIG. 3, a first embodiment of the frequency multiplier device 0A will be described in greater details herein below.

The frequency multiplier device 0A includes three circuitry blocks of a frequency multiplier 102, a mixer circuit 11, and a multiple selector circuit 31.

The input frequency signal f (the frequency is f) is fed as input to the frequency multiplier 102 having a predetermined multiplier factor n to output the output multiplied signal nf (the frequency is nf) multiplied by n as well as fed to the on-off switch circuit 32 in the multiple selector circuit 31.

The mixer circuit 11 is of the single sideband mixer type, accepting the output multiplied signal nf from the frequency multiplier 102 and the input frequency signal f from the on-off switch circuit 32. Those two input signals are input to their respective phase shifter circuits 12 and 13. The phase shifter circuits 12 and 13 output the original signals a and c, and phase sifted signals b and d that have been phase shifted to +π/2 and to −π/2 from the original signals. In the single sideband mixer circuit 11, for the convenience of configuration of the mixer circuits 16 and 17, differential signals are used in general. The output signals a, b, c, and d from the phase shifter circuits 12 and 13 are now assumed to be differential output, respectively. It is also quite possible to have a configuration in which the input frequency signal f and output multiplied signal nf are input as differential signals.

As an example of phase shifter circuits 12 and 13, for the output multiplied signal nf, when a signal cos 2 π nf t is input to the phase shifter circuit 12, following original signal a, a phase shifted signal b can be given as output:

$$a = \cos 2\pi nft \qquad (1)$$

$$b = \cos\{2\pi nft + \pi/2\} \tag{2}$$

Also, when $\cos 2\pi ft$ is input to the phase shifter circuit 13 as the input frequency signal f, following original signal c and phase shifted signal d can be given as output:

$$c = \cos 2\pi ft \tag{3}$$

$$d = \cos\{2\pi ft - \pi/2\} \tag{4}$$

Those output signals a, b, c, and d from the phase shifter circuits 12 and 13 have the signal level adjusted by level shifter circuits 14 and 15 composed of differential amplifiers, then signal a and signal c are mixed by a mixer circuit 16 to obtain a mixed signal Iout, while signal b and signal d are mixed by a mixer circuit 17 to obtain a mixed signal Qout.

The mixer circuits 16 and 17 have a configuration as disclosed in FIG. 6 or in FIG. 7 described later. More specifically, signal a or signal b are input to a first differential pair 20 and to a second differential pair 21. The first and second differential pairs 20 and 21 are connected to a commonly shared load resistors R9 and R10, the connection is such that the differential outputs mutually inverted may be connected to the same load resistors R9 or R10. In addition, another third differential pair 22 may be configured by having both differential pairs 20 and 21 as load circuits in order to accept signal c or signal d as input. A resistor R15 is connected across emitters of the third differential pair 22, the emitters as reference nodes, are also connected to a bias current power supply for supplying bias 10, current to the mixer circuits 16 and 17. In FIG. 6 and FIG. 7, a bias current power supply circuit is configured by connecting resistors R13 and R14 for bias current setting through transistors Q15 and Q16 for the adjustment of bias current level to the ground potential GND.

For signals represented by equations (1) to (4), output signals Iout and Qout mixed by the mixer circuits 16 and 17 are as follows:

$$\begin{aligned} Iout &= a \times c \\ &= \cos 2\delta nft \times \cos 2\delta ft \\ &= [\cos 2\delta\{n+1\}ft + \cos 2\delta\{n-1\}ft]/2 \end{aligned} \tag{5}$$

$$\begin{aligned} Qout &= b \times d \\ &= \cos\{2\delta nft + \pi/2\} \times \cos\{2\delta ft - \pi/2\} \\ &= -\sin 2\delta nft \times \sin 2\delta ft \\ &= [\cos 2\delta\{n+1\}ft - \cos 2\delta\{n-1\}ft]/2 \end{aligned} \tag{6}$$

Two mixed signals Iout and Qout as described above are added each other in a summing amplifier 18 of the following stage to output the output frequency signal fOUT.

The output frequency signal fOUT is given by the phase shifter circuits 12 and 13 with a given amount of phase shift $\pm\pi/2$, so that either one of mixed signals are output as a result of addition by the summing amplifier 18.

From the equations (5) and (6) above, $$fout = Iout + Qout = \cos 2\overline{\sigma}\{n+1\}ft \tag{7}$$

The above description can be applied when neither of output signals a, b, c, and d from the phase shifter circuits 12 and 13 are phase inverted. From mixed signals $\cos 2\overline{\sigma}\{n\pm1\}ft$, only $\cos 2\overline{\sigma}\{n+1\}ft$, signal multiplied by the multiplier factor (n+1), is selected to output.

The inversion of the phase of one of signals by the phase inverter (level shifter circuit (differential amplifier) 14 and selector circuit (SEL1) 33) will be described now in greater details. In the first preferred embodiment, it is assumed that the phase shifted signal d is phase inverted to a phase inverted signal /d. When phase inverted, $$/d = \cos\{2\pi ft + \pi/2\} \tag{8}$$

thus the output signal Qout of the mixer circuit 17 is $$\begin{aligned} Qout &= b \times /d \\ &= \cos\{2\overline{\sigma}nft + \pi/2\} \times \cos\{2\overline{\sigma}ft + \pi/2\} \\ &= \sin 2\overline{\sigma}nft \times \sin 2\overline{\sigma}ft \\ &= [-\cos 2\overline{\sigma}\{n+1\}ft + \cos 2\overline{\sigma}\{n-1\}ft]/2 \end{aligned} \tag{9}$$

therefore, the output frequency signal fOUT is $$fout = \cos 2\overline{\sigma}\{n-1\}ft \tag{10}$$

In this case, from within mixed signals $\cos 2\overline{\sigma}\{n+1\}ft$, only signal multiplied by the multiplier factor (n−1), $\cos 2\overline{\sigma}\{n-1\}ft$ is selected to output.

More specifically, by controlling the phase inversion of the phase shifted signal d, either signal multiplied by the multiplier factor (n−1), $\cos 2\overline{\sigma}\{n-1\}ft$ or signal multiplied by the multiplier factor (n+1), $\cos 2\overline{\sigma}\{n+1\}ft$ from within mixed signals, $\cos 2\overline{\sigma}\{n+1\}ft$ is selected to output as the output frequency signal fOUT.

Typical examples of the phase inverter (level shifter circuit (differential amplifier) 14 and selector circuit (SEL1) 33) will be described in greater details herein later by referring to a typical example shown in FIG. 4 and to another example shown in FIG. 5.

The selector circuit (SEL2) 34 is a circuit used for operating the mixer circuits 16 and 17 as a differential amplifier 25. When selecting output multiplied signal nf multiplied by the multiplier factor n as the output frequency signal fOUT, the selector circuit (SEL2) 34 stops mixing operation of the mixer circuits 16 and 17 while turning off the on-off switch circuit 32 to stop feeding the input frequency signal f input to the single sideband mixer circuit 11. Some components of the circuit are used as differential amplifier 25 to output directly the output multiplied signal nf as output frequency signal fOUT.

Typical example of the mixer circuits 16 and 17 used as a differential amplifier 25 will be described in greater details later by referring to the first embodiment shown in FIG. 6 and the second embodiment shown in FIG. 7.

In the above description, output signals a, b, c, and d from the phase shifter circuits 12 and 13 have been described as phase shifted signals, which use the signal a and signal c as original for phase shifted signal b and signal d by $+\pi/2$ and $-\pi/2$ from the original signals a and c, respectively.

However, it is to be understood that the present invention is not to be limited to the details as above, but may have a similar result when modified by swapping the original signals, by replacing the direction of phase shift of the phase shifted signals, and so on.

Although the phase inverter (level shifter circuit (differential amplifier) 14 and selector circuit (SEL1) 33) have been described with reference to signal d, the present invention is not to be limited thereto, rather the present invention may obtain a similar result when inverting the phase of any one of other signals.

Now a typical example of phase inverter circuit will be described. FIG. 4 shows a first example. In this example, the circuit is composed of two differential amplifiers 14 having differential output connected in an inverted manner so as to be level shifter circuits, and of a bias selector circuit (SEL1) 33 for performing selection of supplying bias current to either one of the differential amplifiers 14 in order to control the phase inversion of input signals. Since the input-output connection of either one of the differential amplifiers 14 selected becomes reversed, the phase inversion of the differential output signals can be toggled on or off with respect to the differential input signals in response to either one of the differential amplifiers 14 selected by supplying bias current.

Two types of selector for the bias selector circuit (SEL1) 33 are shown in the figure. Selector type 1 is shown by (A) in FIG. 4 and selector type 2 by (B) in FIG. 4.

The selector type 1 (A) has a phase inverting bias circuit 33A made by two bias circuits of resistors R5 and R6 for supplying bias current, and first switch circuit 33B made by two switching transistors Q5 and Q6 for connecting to two differential amplifiers 14. More specifically, the resistor R5 and switching transistor Q5 supply bias current to one of the differential amplifiers 14 which constitutes a differential pair with transistors Q1 and Q2, while the resistor R6 and switching transistor Q6 supply bias current to the other one of the differential amplifiers 14 which constitutes a differential pair with transistors Q3 and Q4. The controller circuit (CTL1) 33C uniquely selects either one of transistors Q5 or Q6 to control the phase inversion of the differential input signal.

The selector type 2 (B) has one set of bias circuit 33A constituted by a resistor R5 for supplying bias current, connecting to two switching transistors Q5 and Q6 to form a branch. Each leg is connected to two differential amplifiers 14 as first and second switch circuit. More specifically, the resistor R5 and switching transistor Q5 supply bias current to one of the differential amplifiers 14 constituting a differential pair with transistors Q1 and Q2, while the resistor R5 and switching transistor Q6 supply bias current to the other one of the differential amplifiers 14 constituting another differential pair with transistors Q3 and Q4. The controller circuit (CTL1) 33C uniquely selects either one of transistors Q5 or Q6 to control the phase inversion of the differential input signal.

In the foregoing description, a case has been described in which a phase inverting bias circuit 33A or one set of bias circuit 33A is made by resistors R5 and R6.

It should be noted that the present invention is not to be limited thereto, and any circuit capable of letting a predetermined amount of current flow may be used instead, such as a constant current power supply circuit using transistors in addition to or instead of resistors, and active load circuit using transistors and the like.

The second example shown in FIG. 5 includes an inversion switching circuit 33 for controlling the transposition of input/output of differential signal in the differential amplifier 14 used as the level shifter circuit. More specifically, (A) in FIG. 5 uses a inversion switching circuit 33 on the path of differential input signals at the input side to transpose the inputs of differential input signals into the differential input signal terminals of the differential amplifier 14 to control the phase inversion of the differential output signal. (B) in FIG. 5 uses a inversion switching circuit 33 on the path of differential output signals at the output side to flip the input-output of differential output signals to the differential output terminals of the differential amplifier 14 in order to control the inversion of phase. (C) in FIG. 5 uses an inversion switching circuit 33 interposed between the differential pair and load of the differential amplifier 14 to transpose the input-output of differential signal of the differential amplifier 14 to control the inversion of phase.

For the inversion switching circuit 33, a circuit that can switch paths by means of switching transistor as shown in FIG. 5 can be used.

A typical example of use of the mixer circuits 16 and 17 as a differential amplifier 25 will be described below. In first example shown in FIG. 6, for the mixer circuits 16 and 17 as described above, resistors R13 and R14 are used for the bias current setting as the mixer bias circuit 23. One transistor Q16 of transistors Q15 and Q16 for adjusting bias current level are used as second switch circuit 24. The second switch circuit 24 is turned on and off by a controller circuit (CTL2) 34A. When using the mixer circuits 16 and 17 in the normal mixing operation, the second switch circuit 24 is applied with the bias BON at the same level as the transistor Q15, whereas the bias BOFF is applied so as for the circuit to be turned off when part of the circuit is used as differential amplifier 25.

When the second switch circuit 24 is used as the differential amplifier 25, the on-off switch circuit 32 blocks the input path of input frequency signal f so that the input frequency signal c and its corresponding phase shifted signal d are not input to the third differential pair 22. When the circuitry including the first differential pair 20 is used as the differential amplifier 25, the transistor Q13, which is a component transistor of the third differential pair 22, needs to be turned on. Therefore, by activating a non-equilibrium bias circuit 34B, negative bias B− is applied to the transistor Q14 to turn it off while at the same time positive bias B+ is applied to the transistor Q13 to turn it on. By securing a supply path of the bias current from the mixer bias circuit 23, circuitry including the first differential pair 20 may be used as the differential amplifier 25 while the circuit including the second differential pair 21 may be turned off. It is to be noted that the control circuit (CTL2) 34A and the non-equilibrium bias circuit 34B constitute the selector circuit (SEL2) 34. In this configuration, the mixer circuits 16 and 17 may operate as the differential amplifier 25 so as to output the output multiplied signal nf as the output frequency signal fOUT.

Second typical example shown in FIG. 7 uses the resistors R13 and R14 for bias current setting as the mixer bias circuit 23. The transistors Q15 and Q16 are turned on by applying the bias BON thereto, so as to be capable of adjusting bias current level. When using as the differential amplifier 25, the on-off switch circuit 32 blocks the input path of input frequency signal f so that the input frequency signal c and its corresponding phase shift signal d are not supplied to first and second differential pairs 20 and 21. In order to use the circuitry including the third differential pair 22 as the differential amplifier 25, the first and second differential pairs 20 and 21 must be non-equilibrium to turn on either transistors Q9 and Q12 constituting one side or transistors Q10 and Q11 constituting the other. To do this, the non-equilibrium bias circuit 34B is activated to apply negative bias B− to the transistors Q10 and Q11 to turn them off, while at the same time applying positive bias B+ to the transistors Q9 and Q12 to turn them on. Alternatively, by biasing in the opposite direction to turn the transistors Q10 and Q11 on. In this configuration, the current path from the third differential pair 22 to the load resistors R9 and R10 can be secured so as to use the circuitry including the third differential pair 22 as the differential amplifier 25. It is to be noted here that the selector circuit (SEL2) 34 is constituted by the controller circuit (CTL2) 34B. In this configuration, the mixer circuits 16 and 17 may operate as the differential amplifier 25 to output the output multiplied signal nf as the output frequency signal fOUT.

FIG. 8 shows second embodiment. In this configuration, mixer circuits 1A and 1B, multiple selector circuits 3A and 3B, a frequency multiplier of multiplier factor m 102A may be appropriately added to the fundamental frequency multiplier device 0. By selecting appropriately input frequency signal f, output multiplied signal nf and mf, output frequency signals from each stage (n±1)f, (2n±1)f, 2nf, (n+2)f and so on, a desirable output frequency signal fout having a given multiplier factor can be obtained.

As can be appreciated from the foregoing description, the frequency multiplier device 0A in accordance with the first embodiment of the present invention is constituted of three circuit blocks of the frequency multiplier 102, the mixer circuit 11 including the single sideband mixer circuit, and multiple selector circuit 31. The single sideband mixer circuit 11 upon reception of input frequency signal f and the output multiplied signal nf that is an output signal from the frequency multiplier 102 can derive mixed signals Iout and Qout through the mixer circuits 16 and 17 based on the original signals a and c, corresponding phase shifted signals b and d that are phase shifted from the original signals a and c to ±π/2. By adding these signals Iout and Qout in the summing amplifier 18, the final output frequency signal fout is obtained. The phase inverter circuit (level shifter circuit (differential amplifier) 14 and selector circuit (SEL1) 33) at this point may be used to control the inversion of phase of either one of signals to selectively output one of mixed frequencies (n±1)f as the output frequency signal fOUT.

The output multiplied signal nf may be directly output as output frequency signal fOUT, by turning off the on-off switch circuit 32 to block inputting the input frequency signal f into the single sideband mixer circuit 11 and by stopping the mixing operation of the mixer circuits 16 and 17 by means of the selector circuit (SEL2) 34 to use some components of circuits as differential amplifier 25.

In this manner, there is no need to have one frequency multiplier device for each of frequencies used, as well as to extract or select an output signal from the mixer with an externally equipped filter circuit or the like. In addition, a circuit configuration of a complex control system such as a PLL frequency synthesizer can be omitted. Therefore, the circuitry of a frequency multiplier device 0A to selectively output one among a plurality of frequency signals may become compact, allowing the frequency multiplier device 0A to be much smaller than ever. Also, a compact circuit configuration may permit decreasing the power consumption for the circuit operation, so as to be able to implement a configuration conforming to the requirement of lowering power consumption. Furthermore, a complex control system may be unnecessary in this circuit configuration which is much simpler in the circuit operation so that a much stable operation can be estimated.

Therefore the present invention may provide a frequency multiplier device 0A, which is compact, consumes less power, operates much stably, and which may be preferable to use in a mobile communication device, in particular in a portable device such as a cellular phone.

When setting a predetermined multiplier factor n by the frequency multiplier 102, an output frequency signal fOUT having adjacent multiplier factors (n±1) around the first multiplier factor n that is equal to the predetermined multiplier factor n can be selectively output. This allows a compact circuit configuration to provide the output frequency signal fOUT having three multiplier factors (n±1) and n necessary for switching the carrier frequency, without providing a large scale circuitry.

In the single sideband mixer circuit 11, which outputs one of two frequency signals (n±1)f output as the result of mixing operation, the phase inverter circuit may be formed by two differential amplifiers having differential outputs reversely connected as the level shifter circuit, a bias selector circuit (SEL1) 33 for selectively supplying bias current to either one of the differential amplifiers 14 to control the inversion of phase of the input signals. Since the input/output signals' connection is inverted for each other, the phase of differential output signal can be either passed through or inverted with respect to the differential input signal by selecting a differential amplifier to supply the bias current.

In this manner, by taking advantage of the single sideband mixer circuit 11 that outputs only one of the two frequency signals (n±1)f output as the mixing operation, inversion of the phase of mixed signal allows selective output of the other signal. The phase inverter (14 and 33) may selectively output either one of signals by passing through or inverting the phase of one of mixed signals. Thus the output frequency signal fOUT having a multiplier factor required for switching the carrier frequencies is provided with a small scale compact circuit without a plurality of frequency multiplier devices, external filter circuits, or PLL synthesizers and the like.

By only inverting the connection of input and output signals in the differential amplifier 14, the phase can be inverted. Therefore, when providing only one bias selector circuit (SEL1) 33 for selectively supplying bias current to either one of the two differential amplifiers 14 as a simpler configuration of an inversion switching circuit for switching the signal path, a smaller scale and compact circuit may be configured for outputting the output frequency signal having a multiplier factor required for switching the carrier frequencies, without need to have a plurality of frequency multiplier devices, external filter circuits or PLL synthesizers and the like.

Accordingly, the frequency multiplier device 0A may become compact, and consume less power in operation. Furthermore, the operation of the frequency multiplier device 0A is much simpler so that a much stable operation can be estimated without needs to have a complex control system.

The present invention may provide the frequency multiplier device 0A, which may be preferable to use in a mobile communication device, in particular in a portable device such as a cellular phone.

For the bias selector circuit (SEL1) 33, many types are devised, including one having phase inverting bias circuit 33A with resistors R5 and R6 independently formed as the bias circuit, connected separately and respectively to switching transistors Q5 and Q6 to form first switch circuit 33B (see, (A) of FIG. 4), and another one having a commonly shared resistor R5 to form a set of bias circuit 33A with a selective branch by two switching transistors Q5 and Q6 as first and second switch circuits (see, (B) of FIG. 4).

The phase inverting bias circuit 33A is connected to one of the differential amplifiers 14 connected to the transistor turned on of the switching transistors Q5 and Q6 of the first switch circuit 33B to activate one of the differential amplifiers 14. Then the bias current selectively supplied to either one of the differential amplifiers 14 may cause the inversion of phase. Therefore, in a simple circuit configuration with two differential amplifiers 14 and the first switch circuit 33B used as the bias selector circuit, the first switch circuit 33B may switch the path of bias current in a simple and positive manner so as to control the inversion of phase.

The connection of input and output of the differential signals in the differential amplifier 14 used as the level shifter circuits may be inverted by providing the inversion switching circuit 33. More specifically, the inversion switching circuit 33 may be placed in the input path of the differential input signals to invert the input connections of the differential input signals (see, (A) of FIG. 5), or the inversion switching circuit 33 may be placed in the output path of the differential output signals to invert the output connections of the differential output signals (see, (B) of FIG. 5), and the inversion switching circuit 33 is interposed between the differential pair and the loads of the differential amplifier circuit 14 to invert the connections of input and output of the differential signals of the differential amplifier circuit 14 to control the inversion of phase.

The phase may be inverted by simply inverting the connections between the differential input signals and differential output signals in the differential amplifier 14. Therefore a simple configuration using the inversion switching circuit 33 to switch paths allows the inversion of phase to be controlled in a manner simple and reliable.

When using the mixer circuits 16 and 17 for the differential amplifier 25, the transistor Q16 in the transistors Q15 and Q16 for adjusting the level of bias current in the mixer circuits 16 and 17 is used as the second switch circuit 24. Then the control circuit (CTL2) 34A controls turning on and off. For operating the differential amplifier 25, the bias BOFF is applied to turn off. In addition, the non-equilibrium bias circuit 34B is activated to turn on the transistor Q13 that is a part of the third differential pair 22, while blocking the input path of the input frequency signal f by means of the on-off switch circuit 32. The circuit including the first differential pair 20 may operate as the differential amplifier 25 when securing the supply path of the bias current from the mixer bias circuit 23, while at the same time the second differential pair 21 may be turned off. In this configuration, the mixer circuits 16 and 17 operate as the differential amplifier 25, which may output the output multiplied signal nf as the output frequency signal fOUT.

When the input path of the input frequency signal f is blocked by the on-off switch circuit 32, the non-equilibrium bias circuit 34B is activated to cause non-equilibrium state of the transistor in either one of first and second differential pairs 20 and 21 to turn it on in order to function the part including the third differential pair 22 as the differential amplifier 25. In this configuration, the current path from the third differential pair 22 to the load resistors R9 and R10 is secured so that the circuit part including the third differential pair 22 works as the differential amplifier 25.

With this configuration, the mixer circuits 16 and 17 function as the differential amplifier 25, and output the output multiplied signal nf for the output frequency signal fOUT.

Accordingly, the single sideband mixer circuit 11 may invert the phase to selectively output either one of mixed signals (n±1)f for the output frequency signal fOUT, while either first, second, or third differential pair forming the single sideband mixer circuit 11 may be used as the differential amplifier 25. Therefore a small scaled circuit may output the output multiplied signal nf as the output frequency signal fOUT without a plurality of frequency multiplier devices, external filter circuits, or PLL synthesizers and the like.

In the frequency multiplier device 0B in accordance with the second preferred embodiment of the present invention, mixer circuits 1A and 1B, multiple selector circuits 3A and 3B, a frequency multiplier of multiplier factor of m 102A may be appropriately added to the fundamental frequency multiplier device 0. By selecting appropriately input frequency signal f, output multiplied signal nf, mf and output frequency signals from each stage (n±1)f, (2n±1)f, 2nf, (n+2)f and so on, a desirable output frequency signal fOUT having a given multiplier factor can be obtained.

It is to be understood that the present invention is not to be limited to the details herein given but may be modified within the scope of the appended claims.

For example, the present invention may have a similar result when modified on the output signals a, b, c, and d from the phase shifter circuits 12 and 13, by swapping the original signals, by replacing the direction of phase shift of the phase shifted signals, and so on.

Any other signals than the signal d may equivalently phase inverted.

Also, instead of the phase inverting bias circuit 33A, the resistors R5 and R6 as a set of phase inverting bias circuits 33A, or in addition to the resistors R5 and R6, any circuit capable of letting a predetermined amount of current flow may be used instead, such as a constant current power supply using transistors in addition to or instead of resistors, and active load circuit using transistors and the like.

Although in the foregoing embodiments, aspects of the present invention are described by mainly showing bipolar transistors and partially showing MOS transistors used as switching transistors, the present invention is not limited thereto. The present invention may equivalently use MOS transistors instead of or in addition to the bipolar transistors. For switching transistors, any transistors including the bipolar transistors, junction FET and the like, other than the MOS transistors, may be equivalently used.

In brief, the present invention provides a frequency multiplier device, which may operate with less power consumption, select among a plurality of multiplication frequencies, with a small size circuit configuration, by making use of differential amplifiers for level shifting and mixer circuits.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A frequency multiplier device, comprising:
   a frequency multiplier having predetermined basic multiplier factors;
   a mixer circuit for mixing an input frequency signal of the frequency multiplier with an output multiplied signal from the frequency multiplier;
   a multiple selector circuit for selectively mixing characteristics in the mixer circuits
   wherein the multiple selector circuit controls the mixing characteristics of the mixer circuit and the mixer circuit outputs an output frequency signal of a predetermined objective multiplier factor.

2. The frequency multiplier device set forth in claim 1, wherein the predetermined objective multiplier factor of the output frequency signal based on the input frequency signal is one of:

first multiplier factor by the predetermined basic multiplier factor output from the frequency multiplier, second multiplier factor that 1 is added to the first multiplier factor, and third multiplier factor that 1 is subtracted from the first multiplier factor.

3. The frequency multiplier device set forth in claim 1, wherein the mixer circuit is a single sideband mixer circuit; and the single sideband mixer circuit comprises a phase inverter circuit for controlling phase inversion of either one of the signals of the input frequency signal, the output multiplied signal, and phase shifted signal thereof.

4. The frequency multiplier device set forth in claim 3, wherein amount of phase shift in the phase shifted signal is:

+π/2 with respect to the original signal that is one of the input frequency signal and the output multiplied signal; and −π/2 with respect to other original signals.

5. The frequency multiplier device set forth in claim 3, wherein one of the signals is composed of a pair of differential signals; and the phase inverter circuit comprises:

a differential amplifier to which the one of the signals is input; and an inversion switching circuit for controlling the inversion of input and output in the differential amplifier.

6. The frequency multiplier device set forth in claim 5, wherein the inversion switching circuit comprises an input switching circuit for switching input direction of the one of the signals to the differential amplifier.

7. The frequency multiplier device set forth in claim 5, wherein the inversion switching circuit comprises an output switching circuit for switching output direction of differential output signals of the differential amplifier.

8. The frequency multiplier device set forth in claim 5, wherein the inversion switching circuit comprises a load switching circuit for switching connection between a differential pair forming the differential amplifiers and load circuits.

9. The frequency multiplier device set forth in claim 3, wherein the one of the signals is composed of a pair of differential signals; and the phase inverter circuit comprises:

two sets of differential amplifier having differential outputs mutually connected so as to have one set of differential output signals for one of the input signals inverted with respect to the other, and a bias selector circuit for supplying bias current to the selected one of the two sets of differential amplifier.

10. The frequency multiplier device set forth in claim 9, wherein the two sets of differential amplifier include a phase inverting bias circuit for supplying bias current required for the operation of each circuit;

the phase inverting bias circuit selected by the bias selector circuit selects one of the two sets of differential amplifier.

11. The frequency multiplier device set forth in claim 10, further comprising:

a first switch circuit for connecting between the phase inverting bias circuit and each differential amplifier of the two sets of differential amplifier; wherein the bias selector circuit controls the first switch circuit to connect the one of the differential amplifiers to the phase inverting bias circuit.

12. The frequency multiplier device set forth in claim 9, further comprising:

a set of phase inverting bias circuit;

a first switch circuit for connecting the set of phase inverting bias circuit to one of the two sets of differential amplifier; and a second switch circuit for connecting the set of phase inverting bias circuit to the other of the two sets of differential amplifier; wherein the bias selector circuit turns on one of the first and second switch circuits and turns off the other.

13. The frequency multiplier device set forth in claim 3, wherein the input frequency signal and the output multiplied signal input to the single sideband mixer circuit compose a pair of differential signal;

the frequency multiplier device further comprises an on-off switch circuit for controlling on and off of input path of the input frequency signal to the single sideband mixer; and the single sideband mixer circuit comprises:

an input signal differential pair having an input of the input frequency signal; and a multiplied signal differential pair having an input of the output multiplied signal; wherein the multiplied signal differential pair operates as a differential amplifier when the on-off switch circuit blocks the input of the input frequency signal.

14. The frequency multiplier device set forth in claim 13, further comprising:

first and second differential pairs incorporated in the input signal differential pair, differential outputs of either the first and second differential pairs being connected to the other differential outputs in inverse relation;

a third differential pair incorporated in the multiplied signal differential pair, the third differential pair using the first and second differential pairs as active load; and a non-equilibrium bias circuit for making the first and second differential pairs non-equilibrium state when the on-off switch circuit blocks the input of the input frequency signal;

wherein the third differential pair forms a differential amplifier.

15. The frequency multiplier device set forth in claim 13, further comprising:

first and second differential pairs incorporated in the multiplied signal differential pair, differential outputs of either the first and second differential pairs being connected to the other differential outputs in inverse relation;

a third differential pair incorporated in the input signal differential pair, the third differential pair using the first and second differential pairs as active load; and a non-equilibrium bias circuit for making the third differential pair to non-equilibrium state when the on-off switch circuit blocks the input of the input frequency signal;

wherein either the first or the second differential pair connected to components of conductive side of the third differential pair comprises a differential amplifier.

16. The frequency multiplier device set forth in claim 15, further comprising:

a resistor for connecting reference terminals of the third differential pair;

two sets of mixer bias circuit connected to each of the reference terminals;

a second switch circuit for connecting between one of the two sets of mixer bias circuit and the reference terminals; and the non-equilibrium biasing circuit for biasing the components in the one side of the third differential pair that is not connected to the second switch circuit into conductive state, when the on-off switch circuit blocks the input of the input frequency signal; wherein the second switch circuit is turned off when the input of the input frequency signal is blocked, while one of the first and the second differential pairs connected to components of conductive side of the third differential pair comprises a differential amplifier.

17. The frequency multiplier device set forth in claim 1, further comprising:

one or more other mixer circuits; and one or more other multiple selector circuits for selecting one or more other mixing characteristics in the one or more other mixer circuits to selectively output one or more other output signals of one or more other predetermined multiplier factors; wherein either two of the input frequency signal, the output multiplied signal, the output frequency signal or the one or more other output signals are sequentially input into another one of the one or more other mixer circuits.

18. (Once Amended) The frequency multiplier device set forth in claim 17, further comprising:

one or more other frequency multipliers for multiplying the input frequency signal, one or more other output multiplied signals, the output frequency signal or the one or more other output signals; wherein the multiplied signal is input to another one of the other mixer circuits.

19. A frequency multiplier circuit, comprising:

a frequency multiplier having predetermined basic multiplier factors;

a mixer circuit for mixing an input frequency signal of the frequency multiplier with an output multiplied signal from the frequency multiplier;

a multiple selector circuit for selectively mixing characteristics in the mixer circuit wherein the multiple selector circuit controls the mixing characteristics of the mixer circuit and the mixer circuit outputs an output frequency signal of a predetermined objective multiplier factor.

20. The frequency multiplier circuit set forth in claim 19, wherein the predetermined objective multiplier factor of the output frequency signal based on the input frequency signal is one of:

first multiplier factor by the predetermined basic multiplier factor outputting from the frequency multiplier, second multiplier factor that 1 is added to the first multiplier factor, and third multiplier factor that 1 is subtracted from the first multiplier factor.

* * * * *